(12) United States Patent
Nguyen et al.

(10) Patent No.: US 12,362,715 B2
(45) Date of Patent: Jul. 15, 2025

(54) VOLTAGE CONTROLLED ATTENUATOR

(71) Applicant: MACOM Technology Solutions Holdings, Inc., Lowell, MA (US)

(72) Inventors: Duy Nguyen, Lowell, MA (US); Wayne Kennan, Lowell, MA (US)

(73) Assignee: MACOM Technology Solutions Holdings, Inc., Lowell, MA (US)

(*) Notice: Subject to any disclaimer, the term of this patent is extended or adjusted under 35 U.S.C. 154(b) by 0 days.

(21) Appl. No.: 18/141,947

(22) Filed: May 1, 2023

(65) Prior Publication Data
US 2023/0275549 A1    Aug. 31, 2023

Related U.S. Application Data

(63) Continuation of application No. 17/052,800, filed as application No. PCT/US2019/031190 on May 7, 2019, now Pat. No. 11,641,181.
(Continued)

(51) Int. Cl.
*H03F 3/45* (2006.01)

(52) U.S. Cl.
CPC ..... *H03F 3/45183* (2013.01); *H03F 3/45188* (2013.01)

(58) Field of Classification Search
CPC ............ H03F 3/45183; H03F 3/45188; H03F 2203/45476; H03F 2203/45544;
(Continued)

(56) References Cited

U.S. PATENT DOCUMENTS 4,837,530 A * 6/1989 Kondoh .................. H01P 1/227
    333/262
5,337,011 A    8/1994 French et al.
(Continued)

FOREIGN PATENT DOCUMENTS

CN    101834567 A    9/2010
CN    103138687 A    6/2013
(Continued)

OTHER PUBLICATIONS

Nguyen et al., "A 1.5-45-GHz High-Power 2-D Distributed Voltage-Controlled Attenuator", IEEE, vol. 65, Nov. 2017. (Year : 2017).*
(Continued)

*Primary Examiner* — Andrea Lindgren Baltzell
*Assistant Examiner* — Khiem D Nguyen
(74) *Attorney, Agent, or Firm* — Jason H. Vick; Amped IP LLC

(57) ABSTRACT

An amplifier system with high gain, compact size, and extended bandwidth is disclosed. The amplifier system includes one or more inputs configured to receive one or more input signals and a pre-driver configured to receive the one or more input signals. The pre-driver may comprise source connected FETs which create a virtual ground and may include inductors which cancel or counter parasitic capacitance of the FETs. The pre-driver amplifies the one or more input signals to create one or more pre-amplified signals, which are provided to a voltage divider network configured to reduce a DC bias voltage of the one or more pre-amplified signals, while maintaining a wide bandwidth range. An amplifier receives and amplifies the output of the voltage divider network to create amplified signals. The amplifier may comprise mirrored FET pairs in a common source configuration and a common gate arrangement.

14 Claims, 9 Drawing Sheets

Related U.S. Application Data

(60) Provisional application No. 62/668,084, filed on May 7, 2018.

(58) Field of Classification Search
CPC . H03F 2203/45554; H03F 2203/45566; H03F 2203/45652; H03F 1/0211; H03F 1/223; H03F 1/301; H03F 3/607
USPC .......................................................... 330/253
See application file for complete search history.

(56) References Cited

U.S. PATENT DOCUMENTS

| | | | |
|---|---|---|---|
| 6,046,642 A | | 4/2000 | Brayton |
| 6,229,375 B1 * | | 5/2001 | Koen ..................... H03G 7/001 |
| | | | 327/350 |
| 7,714,658 B1 * | | 5/2010 | Striflier ............... H03G 1/0088 |
| | | | 330/254 |
| 8,203,384 B1 | | 6/2012 | Thiagarajan et al. |
| 8,704,592 B2 | | 4/2014 | Tatsumi |
| 8,890,598 B2 * | | 11/2014 | Jordan ..................... H03H 7/25 |
| | | | 333/81 R |
| 9,641,136 B2 | | 5/2017 | Tatsumi |
| 10,651,825 B2 * | | 5/2020 | Chen .............. H03K 19/018507 |
| 11,641,181 B2 | | 5/2023 | Kennan et al. |
| 2002/0113656 A1 | | 8/2002 | Iwai |
| 2005/0280467 A1 | | 12/2005 | Shi et al. |
| 2009/0108935 A1 | | 4/2009 | Kuo et al. |
| 2012/0262235 A1 | | 10/2012 | Hoogzaad |
| 2013/0043877 A1 | | 2/2013 | Tang |
| 2016/0190993 A1 | | 6/2016 | Nobbe et al. |
| 2016/0254793 A1 | | 9/2016 | Su et al. |

FOREIGN PATENT DOCUMENTS

| | | |
|---|---|---|
| JP | S 60-109309 A | 6/1985 |
| JP | 2004-531164 A | 10/2004 |
| JP | 2013-157929 A | 8/2013 |
| KR | 10-1690431 | 12/2016 |

OTHER PUBLICATIONS

International Search Report for International Application No. PCT/US2019/031190, mailed Aug. 22, 2019.
Written Opinion for International Application No. PCT/US2019/031190, mailed Aug. 22, 2019.
International Preliminary Report on Patentability for International Application No. PCT/US2019/031190, mailed Nov. 19, 2020.
First Office Action (Including Translation) for corresponding Chinese Patent Application No. 201980039114.8, mailed Mar. 7, 2024.
Second Office Action (Including Translation) for corresponding Chinese Patent Application No. 201980039114.8, mailed Sep. 26, 2024.
Notification of Decision to Grant (Including Translation) for corresponding Chinese Patent Application No. 201980039114.8, mailed Jan. 27, 2025.
European Search Report for corresponding European Patent Application No. 19799341.3, mailed Dec. 10, 2021.
Notification of Reasons for Refusal (Including Translation) for corresponding Japanese Patent Application No. 2020-562758, mailed Jul. 25, 2023.
Notification of Reasons for Refusal (Including Translation) for corresponding Japanese Patent Application No. 2020-562758, mailed Dec. 19, 2023.
Decision to Grant (Including Translation) for corresponding Japanese Patent Application No. 2020-562758, mailed Aug. 13, 2024.
Office Action for U.S. Appl. No. 17/052,800, mailed Dec. 21, 2021.
Office Action for U.S. Appl. No. 17/052,800, mailed May 13, 2022.
Office Action for U.S. Appl. No. 17/052,800, mailed Sep. 14, 2022.
Notice of Allowance for U.S. Appl. No. 17/052,800, mailed Jan. 3, 2023.
Office Action for corresponding European Patent Application No. 19799341.3, mailed May 9, 2025.

* cited by examiner

VOLTAGE CONTROLLED ATTENUATOR

CROSS REFERENCE TO RELATED APPLICATIONS

This application is a Continuation of U.S. patent application Ser. No. 17/052,800, filed Nov. 3, 2020, now U.S. Pat. No. 11,641,181, which is a national stage application under 35 U.S.C. 371 of International Application No. PCT/US2019/031190, filed May 7, 2019, which designated the United States, which PCT Application claims the benefit of and priority under 35U.S.C. § 119(e) to U.S. Patent Application No. 62/668,084, filed May 7, 2018, entitled "Compact High Gain Amplifier With DC Coupled Stages," all of which are incorporated herein by reference in their entirety.

FIELD OF THE INVENTION

The field of the invention relates to amplifiers and voltage-controlled attenuators and in particular to an improved distributed amplifier and improved voltage-controlled attenuator.

BACKGROUND

Distributed amplifiers, also known as traveling wave amplifiers, are a common amplifier configuration for wide bandwidth applications. FIG. 1 illustrates an example circuit of an exemplary prior art distributed amplifier. The distributed amplifier of FIG. 1 is a single ended configuration. As shown, an input node 104 is configured to receive a data signal to be amplified. The input node 104 connects to an inductor 108A. The opposite terminal of the inductor 108A connects to an inductor 108B and a first amplifier section 112A. The inductors 108 are in a circuit section defined herein as the input line.

The amplifier section 112A comprises two transistors connected source to drain as shown. The gate terminal of FET 154 connects to the inductors 108A and 108B. A capacitor 162 connects the gate terminal of FET 150 to ground. The drain terminal of the FET 150 connects to inductors 120A, 120B as shown. The opposite terminal of inductor 120A connects to an output termination resistor RD 130, which in turn connects to capacitor 134. Resistor RD 130 may also be referred to a drain resistor that is used for impedance matching and to set the output impedance. The opposite terminal of the capacitor 134 connects to ground. The output termination resistor RD 130 and capacitor 134 establish the output impedance seen from an output node 124. The inductors 120A, 120B are in a circuit section defined as the output line 122.

The FETs 150, 154 of the amplifiers sections 112 have parasitic capacitance and the inductors 108A, 108B, 120A, 120B arranged in the circuit are selected to cancel or counter the parasitic capacitance associated with the amplifier sections.

The arrangement of amplifier sections 112A and inductors 108A, 108B, 120A, 120B repeats with one or more additional amplifying sections 112B and inductors 108C, 108N and 120C and 120N where N is any whole number. An output node 124 connects to the inductor 120N. An inductor 170 also connects to the output node 124 and to a supply voltage VD 166. The supply voltage 166 provides a DC supply voltage to the circuit, for biasing.

Also, part of this distributed amplifier is an input termination resistor 140 and a capacitor 144 which connect in series to ground to provide input impedance matching. A supply voltage VG 150 is supplied at a node between the input termination resistor 140 and capacitor 144.

Although shown with two amplifier sections 112A, 112B, it is contemplated that any number of sections may be implemented to increase gain or establish other circuit characteristics.

In operation, the input signal is presented to the input node 104 and in turn to the first amplifier section 112A where it is amplified, and the amplified signal is presented on the output line 122. The process repeats through one or more additional amplifier sections 112 such that an amplified output signal is presented on the output node 124. The input impedance is set, at least in part, by the input termination resistor RG 140 and capacitor 144. The resistor RG 140 may also be referred to a gate resistor used to set input impedance. The output impedance is set, at least in part, by the output termination resistor 130 and capacitor 134. The inductors 108A, 108B, 120A, 120B cancel the parasitic capacitance of the amplifier sections.

FIG. 2 illustrates an example circuit arrangement for an exemplary prior art distributed amplifier in a differential mode configuration. As compared to FIG. 1, similar elements are labeled with similar reference numbers. However, due to the differential configuration the arrangement is a mirrored collection of components. As is understood in the art, the differential configuration includes two inputs 104-P and 104-N. The inputs 104-P, 104-N receive differential signals that are 180 degrees out of phase with respect to the other. The signal of interest is the difference between the differential signal presented on inputs 104-P, 104-N. The -P and -N designations reflect the two separate but similar arrangements of elements, which are generally mirrored to form the differential configuration. Likewise, the inductors 108 are separated by -P and -N designation with the reference numbers. Due to the generally similar, but duplicate nature of the differential configuration, in the discussion of FIG. 2 only the aspects of FIG. 2 which differ from FIG. 1 are discussed.

FIG. 2 includes differential amplifier sections 208A, 208B which connect as shown to the input lines 110-P and 110-N and the output lines 122-P and 122-N. Each differential amplifier section 208 includes several components. As in FIG. 1, connected between inductors 108A-P and inductors 108B-P is a gate terminal of FET 224A. The drain terminal of FET 224A connects to the source terminal of a FET 228A. This configuration is mirrored with FETs 224B and 228B as shown such that the gate terminals of FETs 228A, 228B are connected and the source terminals of FETs 224A, 224B are connected. This is referred to as a common source configuration for the FETs 224 and a common gate arrangement for the FETs 228. The drain terminals of FETs 228A and 228B connect to the output lines 122-P and 122-N. A capacitor 232 connects between ground and the gate terminals of FETs 228A, 228B. A current source 220 connects between ground and the source terminals of FETs 224A, 224B. The node between the current source 220 and the source terminals of the FETs 224 becomes a virtual ground when presented with a differential signal. One or more additional differential amplifying sections 208B are similarly configured.

In operation, a differential signal is presented on the inputs 104-P and 104-N and thus presented to the differential amplifier sections 208A, . . . 208B while the amplified version of the input signals is presented on the outputs 124-P and 124-N. Similar to FIG. 1, the supply voltage VD 166-P provides the bias for the positive side of the amplifier through an inductor 170-P. The voltage VD 166-N and inductor 170-N provide the bias for the negative side of the amplifier. In the differential amplifier configuration, the voltage VD 166-P and 166-N either have equal values or can be connected to the same DC voltage supply. Also, in this embodiment, the inductor 170-P and inductor 170-N are identical but may be different in value in other embodiments. The voltage supply VG 150 is supplied at the node between resistor 140-P and resistor 140-N to provide the gate bias for both sides of the differential amplifier.

While prior art designs, such as those shown in FIGS. 1 and 2 are suitable for certain applications, improvements would benefit the state of the art. Disclosed herein are improvements to amplifiers as are discussed below.

SUMMARY

To overcome the drawbacks of the prior art and provide additional benefits, disclosed is an amplifier section comprising one or more inputs configured to receive one or more input signals. Connected to the inputs is a pre-driver having mirrored transistors and a current source. The pre-driver is configured to receive the one or more input signals and amplify the one or more input signals to create one or more pre-amplified signals. Also provided is a voltage divider network having one or more resistor and one or more capacitors, such that the voltage divider network is configured to receive the one or more pre-amplified signals and reduce a DC bias voltage of the one or more pre-amplified signals while achieving a flat gain response across the frequency band of operation to thereby create one or more amplifier input signals.

Also provided is an amplifier having cascode configured transistors configured to receive and amplify the one or more amplifier input signals to create one or more amplified signals. An interstage connects the pre-driver to the amplifier such that the interstage is configured with one or more inductors.

In one embodiment, the interstage further includes one or more capacitors. The voltage divider network may include one or more capacitors in parallel with one or more resistors. In one configuration, the amplifier having two transistors in a cascode configuration comprises a first transistor pair which have source terminals connected and a second transistor pair having gate terminals connected such that the first transistor pair and second transistor pair are connected drain to source.

Also disclosed is an amplifier comprising one or more inputs configured to receive one or more input signals and a pre-driver configured to receive the one or more input signals and amplify the one or more input signals to create one or more pre-amplified signals. A voltage divider network is part of this embodiment and is configured to receive the one or more pre-amplified signals and reduce a DC bias voltage of the one or more pre-amplified signals to create one or more amplifier inputs. An amplifier is configured to receive and amplify the one or more amplifier inputs to create one or more amplified signals.

In one embodiment, the pre-driver comprises source connected field effect transistors (FET). The voltage divider network may comprise at least one capacitor and at least one resistor. In one embodiment, the voltage divider network comprises two resistors in parallel with a capacitor. It is contemplated that the amplifier is configured to amplify differential signals. In one configuration, the amplifier's current source may operate as a current mirror and the one or more amplifier inputs are provided to gate terminals of one or more FETs. As discussed herein, the amplifier includes a first pair of field effect transistors configured with connected gate terminals, and the amplifier includes a second pair of field effect transistors configured with connected source terminals. This embodiment may further comprise at least one interstage connecting the pre-driver to the amplifier. The interstage may further comprise a capacitor configured to increase cut-off frequency.

Also disclosed is a method for amplifying an electrical signal comprising receiving the signals to be amplified, performing amplification on the signals with a pre-driver to generate a pre-amplified signal, and providing the pre-amplified signal to a voltage divider network. Then, adjusting the voltage of the pre-amplified signal with the voltage divider network to create voltage adjusted signals and providing the voltage adjusted signals to an amplifier. Thereafter, amplifying the voltage adjusted signal with the amplifier to create amplified signals and outputting the amplified signals.

In one embodiment, the signals comprise differential signals. The amplifier may comprise a pair of source connected transistors. It is contemplated that the voltage divider network may comprise a capacitor that connects directly to a gate terminal of the source connected transistors and two or more resistors, one of which connects to a source terminal of the source connected transistors. The amplifier may further comprise a pair of gate connected transistors. In one configuration, the step of adjusting the voltage of the pre-amplified signal comprises reducing the DC bias voltage provided to the amplifier to achieve a flat gain response from low frequency to high frequency.

Also disclosed is an attenuator comprising a first input configured to receive a first input signal and a second input configured to receive a second input signal. The first input signal and the second input signal form a differential input signal. A control signal input is configured to receive a control signal that adjusts a level of attenuation of the differential input signal. Also part of this embodiment is a first output configured to present a first output signal and a second output configured to present a second output signal. The first output signal and the second output signal form a differential output signal, which, responsive to the control signal, is an attenuated version of the differential input signal. An input signal path, having one or more resistors, is provided between the first input and the first output while an output signal path, having one or more resistors, is provided between the second input and the second output. A first FET device connects to the input signal path such that a drain terminal of the first FET device connects to the input signal path and a gate terminal connects to the control signal input. At least one additional FET device is series connected with the first FET device such that a control terminal of the first FET device and the at least one additional FET device connects to the control signal input.

In one embodiment, the control terminal of the first FET device and the at least one additional FET device comprise gate terminals and the attenuator is voltage controlled. In one configuration, the FET devices have a gate terminal, a drain terminal, and a source terminal such that the gate terminal receives the control signal, and the FET devices are connected in series, drain to source, between the signal input path and the signal output path. The difference between the first input signal and the second input signal is distributed across the first FET device and the at least one additional FET device thereby reducing to voltage across each FET device. The attenuator may further comprise one or more resistors connected between a drain terminal and a source terminal of each of the first FET device and the at least one additional FET devices. In addition, the attenuator may further comprise an amplifier connected to receive the attenuated version of the differential input signal. One or more resistors may be placed between the control signal input and the gate terminal of the first FET device and the gate terminal of the at least one additional FET device.

Also disclosed is a voltage controlled attenuator having an input configured to receive an input signal and a control signal input configured to receive a control signal that adjusts a level of attenuation applied to the input signal. An output is configured to present an output signal, such that the output signal is subject to attenuation as determined by the control signal. A signal path is provided that has one or more resistors, between the input and the output. A first FET device connects to the signal path such that a drain terminal connects to the signal path and a gate terminal connects to the control signal input. One or more additional FET devices are provided that are series connected drain to source to a source terminal of the first FET device such that a gate terminal of each of the one or more additional FET devices connects to the control signal input. A ground node connected to a source terminal of a last FET device of the one or more additional FET devices.

The voltage controlled attenuator may further comprise one or more resistors between the control signal input and the gate terminal of the first FET device and the gate terminal of the one or more additional FET devices. In addition, the control signal selectively establishes the first FET device and the one or more additional FET devices as variable resistors to divert some of the input signal to ground and the diversion of the input signal to ground is distributed across the first FET device and the one or more additional FET devices. The voltage controlled attenuator may further include one or more resistors connected between a drain terminal and a source terminal of the first FET device and the one or more additional FET devices.

Also disclosed is a method for attenuating a signal. In one embodiment, this method receives an input signal at a first signal path and a second signal path as well as receiving a control signal at a control signal input. The control signal determines or controls an amount of attenuation to be applied to the input signal. Then, applying the control signal to a gate terminal of two or more variable resistors such that the control signal adjusts the resistance of the two or more variable resistors. The two or more variable resistors are connected between the first signal path and the second signal path. Responsive to the control signal adjusting the resistance of the two or more variable resistors, diverting a portion of the input signal from the first signal path to the second signal path through the two or more variable resistors which attenuates the input signal to create an attenuated output signal. Finally, this method outputting the attenuated output signal.

In one embodiment, the portion of the input signal that is diverted from the first signal path to the second signal path is distributed across the two or more variable resistors. The input signal may be a differential signal. The two or more variable resistors may comprise two or more FET devices that are series connected drain to source. This method may further comprise maintaining linearity of the two or more FET devices with one or more resistors connected between a drain terminal and a source terminal of each of the two or more FET devices. In one configuration, this method further comprises isolating the control signal the two or more FET devices receive and inhibiting any high frequency components in the control signal from reaching a gate terminal of the two or more FET device with a resistor between the control signal input and a gate terminal of the two or more FET devices.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DISCUSSION OF INVENTION

Figure 1:
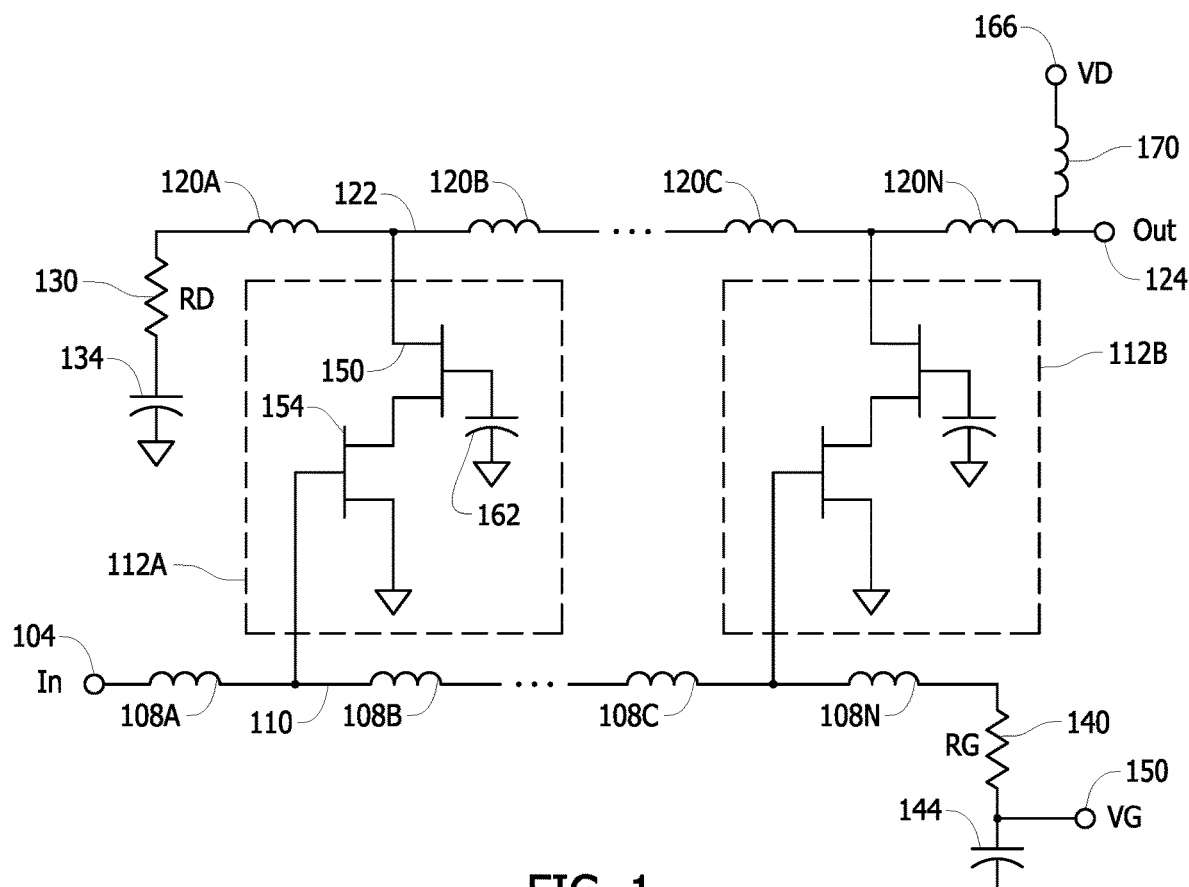
FIG. 1 illustrates an example circuit of an exemplary prior art distributed amplifier.
Figure 2:
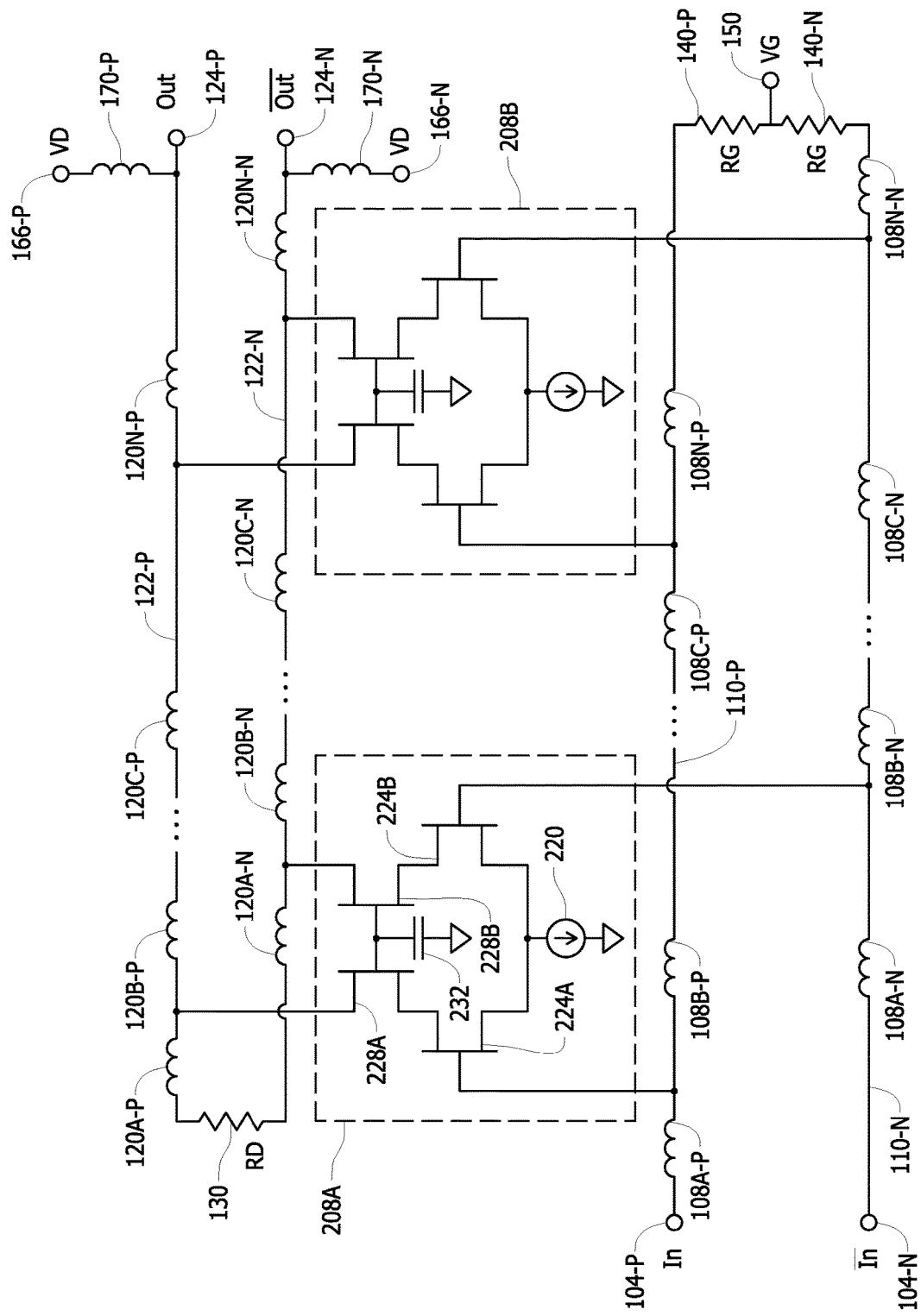
FIG. 2 illustrates an example circuit arrangement for an exemplary prior art distributed amplifier in a differential mode configuration.

While distributed amplifiers such as those identified in FIG. 1 and FIG. 2 are widely used, improvements are possible over the prior art. One area for improvement over the prior art is significantly higher gain for a given amplifier size, which also correlates to size reductions for a given level of amplification (gain). Thus, this system improves the prior art by reducing the size of a distributed amplifier while maintaining the same or higher gain level, and also maintaining or increasing bandwidth. In addition, this system provides a high gain, high bandwidth (100 KHz to 50 GHz) amplifier in a compact energy efficient design. As compared to the prior art, high gain can be achieved without resorting to larger FETs or reducing bandwidth or, for a given FET size, the maximum gain is extended.

Figure 3A:
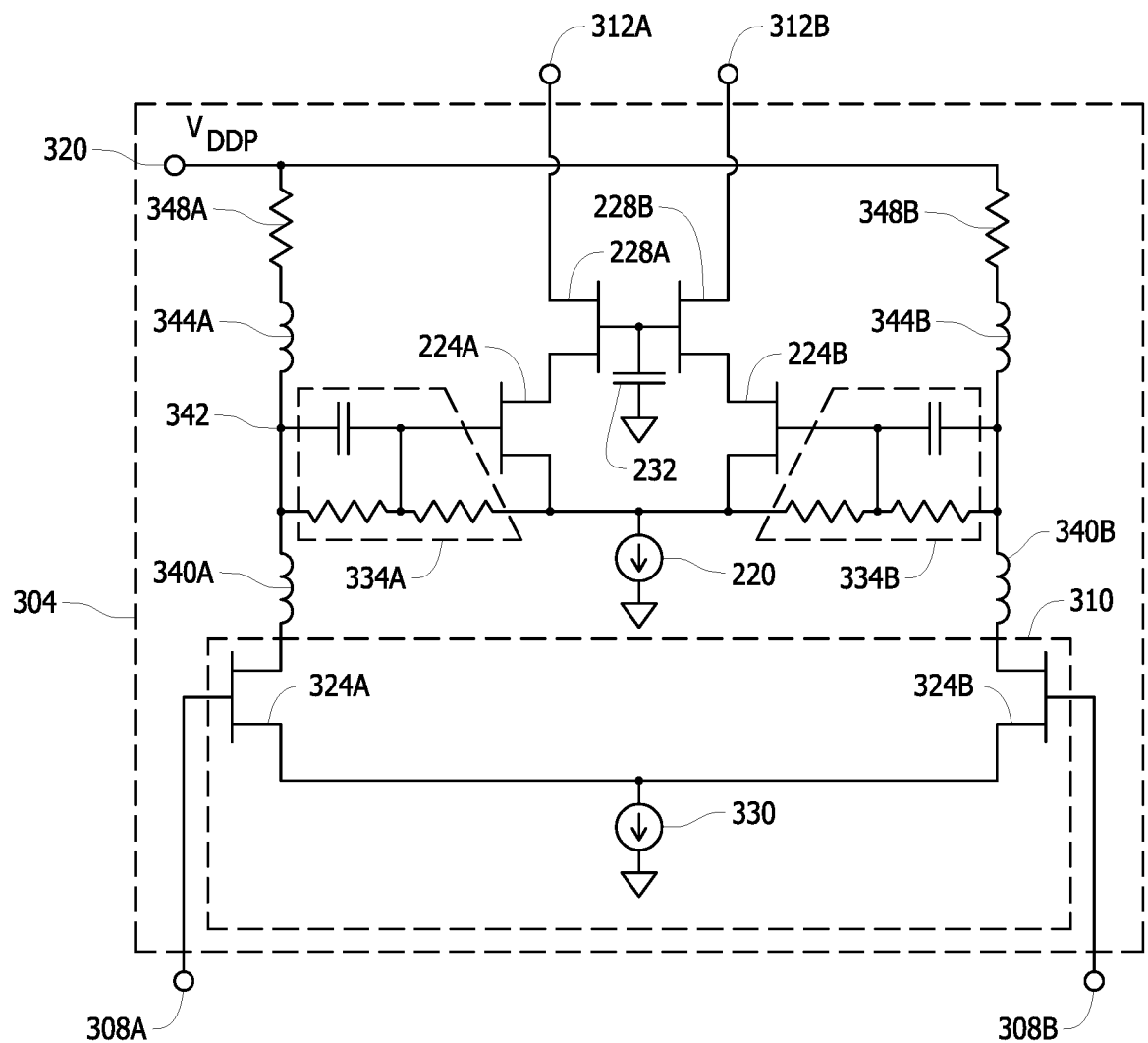
FIG. 3A illustrates an improved amplifier section, such as would be used in the distributed amplifier of FIG. 2.

FIG. 3A illustrates an improved amplifier section, such as would be used in the distributed amplifier of FIG. 2. To reduce complexity and focus on the innovative aspects of the distributed amplifier, only one amplifier section is shown, but in use multiple amplifier sections may be provided in a distributed amplifier. As compared to FIGS. 1 and 2, similar components are labeled with identical reference numbers and the discussion of those elements are not repeated.

Pre-Driver Section

In this embodiment, the amplifier section 304 has input terminals 308A and 308B. Input terminal 308A connects to input line 110-P of FIG. 2 while input terminal 308B connects to input line 110-N. These connections provide the differential signal to the amplifier section 304. The input terminals connect to a pre-driver section 310 as shown. The pre-driver section consists of transistors 324, current source 330, as well as inductors 340 and 344, capacitors/resistors 334 and termination resistor 348. In this embodiment, the pre-driver section 310 includes source connected FETs 324A, 324B. The gate of FET 324A connects to the input terminal 308A, while the gate of FET 324B connects to the input terminal 308B. The source terminals of each FET 324A, 324B are connected to each other and to a current source 330, which also connects to ground. The pre-driver 310 serves as a first amplifier stage that amplifies the differential input signals prior to amplification by the additional amplifiers of the amplifier section 304.

Each pre-driver FET 324 has a drain terminal that connects to inductors 340A, 340B as shown. The opposing terminals of the inductors 340A, 340B connect to a voltage divider network 334A, 334B while inductors 344A, 344B connect in series with resistors 348A, 348B. The inductors 340A, 340B act to cancel or counter the parasitic capacitance of the FETs. The opposing terminal of the resistors 348A, 348B connects to a pre-driver voltage supply node 320. In this embodiment the inductors 344A, node 342, and inductor 340A appear or behave as a transmission line. Resistor 348A is a termination resistor and such that from node 342 the transmission line appears as a 50 ohm termination. Node 342 may appear as a capacitor to ground. In this embodiment, the voltage divider networks 334A, 334B comprise a capacitor that connects directly to the gate terminal of FETs 224A, 224B and two resistors, one of which connects to the common source terminals of the FETS 224A, 224B. The voltage divider network reduces the DC bias voltage provided to the gate terminal of the FETs 224A, 224B and achieves a flat gain response from low frequency to high frequency (for example, but not limited to 100 KHz to 50 GHz).

By adding the pre-driver section 310 and other associated circuitry to the distributed amplifier, the gain of each amplifier section 304 is increased without increasing the size of the FETs within the amplifier section, thus avoiding the bandwidth reduction associated with larger FET size. Furthermore, two or more pre-driver sections can be added to achieve significantly higher gain while maintaining the same bandwidth and very little increase in chip size. These are improvements over the prior art.

Although this embodiment of FIG. 3A is shown with a single pre-driver 310 and an amplifier stage made up of devices 224, 228, it is also contemplated that additional stages 224, 228 may be provided within the amplifier section 304. Likewise, one or more sections 304 may be combined as shown in FIG. 3C.

In operation, the differential input signals are provided on input terminals 308A, 308B and amplified by the pre-driver stage 310. The node between the capacitor of the voltage divider network 334A, 334B and the inductors 344, 340 will appear as a capacitor connected to ground. In one embodiment, the resistor 348A, 348B has a value of 50 ohms. The inductors 340, 344 are realized by a spiral inductor design but can be generalized to behave as transmission lines. Circuit behavior is symmetric due to the differential nature of the configuration. The resistor 348 connected to Vddp is provided and selected to establish a broad gain from the first stage (pre-driver 310), and absent this resistor the frequency response would not be ideal. The resistor 348 also provides a uniform voltage versus frequency into the cascoded transistors 224, 228 and thus acts like a termination resistor in operation. Amplifier stage outputs 312A, 312B are shown at the top of FIG. 3A. The amplifier formed by devices 224, 228 may be referred to as the second stage.

In one mode of operation, the pre-driver transistors appear as if they are driving a constant impedance from a very low to a very high frequency. These frequencies may range from 100 kilohertz to 50 gigahertz. For low frequency operation, the resistor 348 controls operation, such as the low frequency range or cutoff, while the inductors, capacitor and FET sizes control the high frequency range or cutoff.

When presented with an input signal on terminals 308, the gate terminal of the FET 324 is activated such that both FETS 324A, 324B are driven simultaneously. These FETs 324 enter conduction mode causing the current to flow through the pre-driver FETs between the drain terminal and the source terminal. The node commonly connected to the source terminals of the FETs 324A, 324B and the current source appears as a virtual ground. The current source 330 biases the transistor to establish a DC current into the transistors 324A, 324B. AC inputs presented on the input terminals 308A, 308B then create a current through the FETs 324A, 324B, which in turn causes current flow through the resistor 348, and inductors 344, 340. This current from Vddp node 320 to the current source 330 establishes a voltage between the inductors 340, 344, which is also the input to the voltage divider 334, and the gate terminal of the FETs 224. This may be considered the first level of signal amplification performed by the pre-driver 310.

Voltage Divider Network

Also shown in FIG. 3A is a voltage divider 334A, 334B. It includes a capacitor and two resistors connected as shown. This voltage divider network 334A, 334B divides or reduces the input voltage provided to the gate of the cascoded transistors 224, 228. In certain embodiments, the DC voltage at node 342 is too high for direct connection to the gate of the FET 224. For high frequency components, the FET will appear as a capacitor to ground. This capacitor and the capacitor that is in series with the gate terminal of FET 224 acts as a voltage divider due to the behavior of the series connected capacitors. The capacitor passes the high frequency signals. In addition, at low frequencies, the capacitor appears as an open circuit. As such, low frequencies pass through the resistors. The resistors appear as open circuits to high frequencies. If the resistor ratio and capacitor to FET gate capacitance ratio are designed similarly, this network provides a generally flat frequency response from low frequency ranges such as 100 KHz to 50 GHz. This is a novel addition in optical applications and differential pair amplifier environments.

Figure 3B:
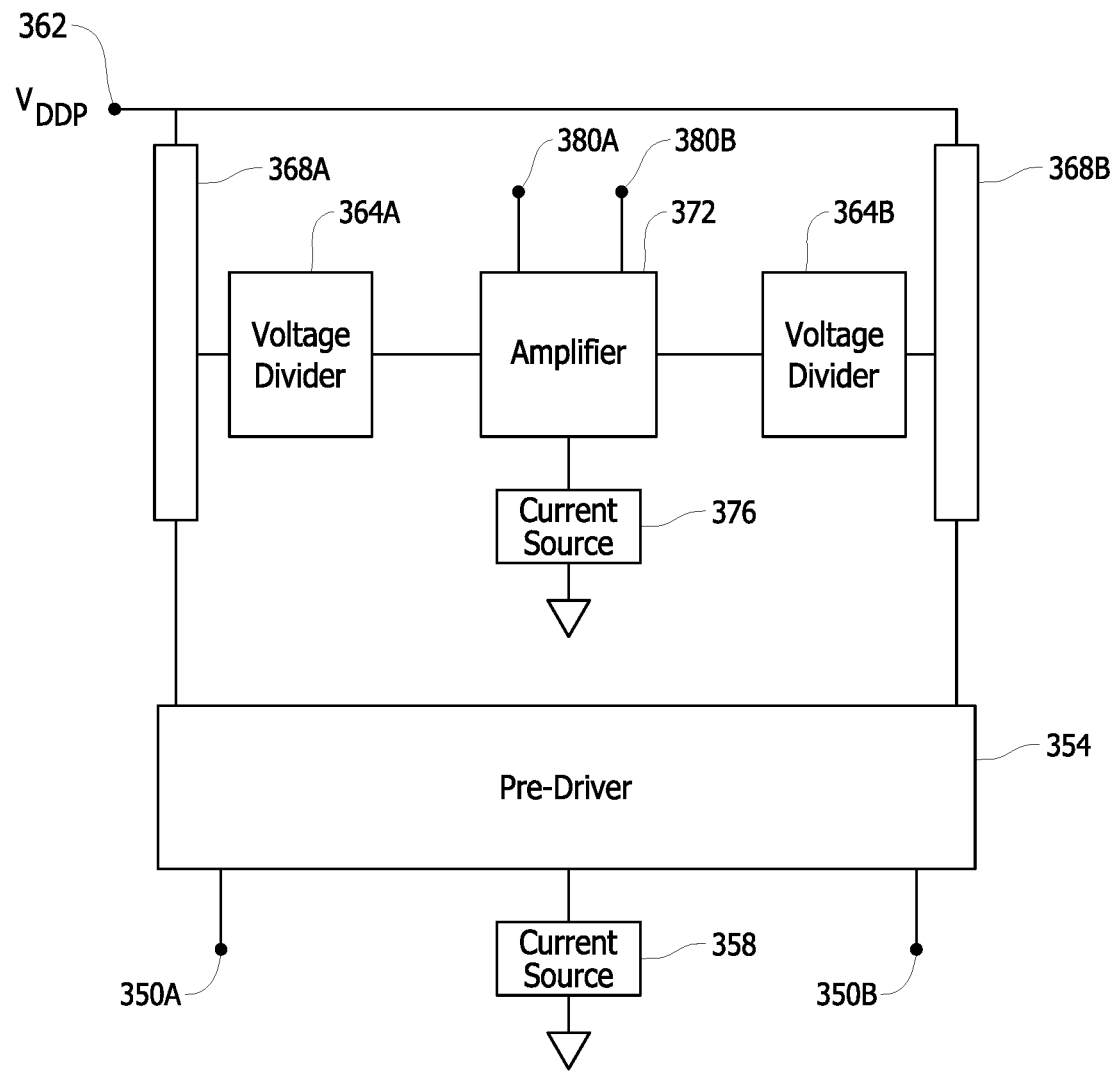
FIG. 3B illustrates a block diagram of the amplifier section of FIG. 3A.
Figure 3C:
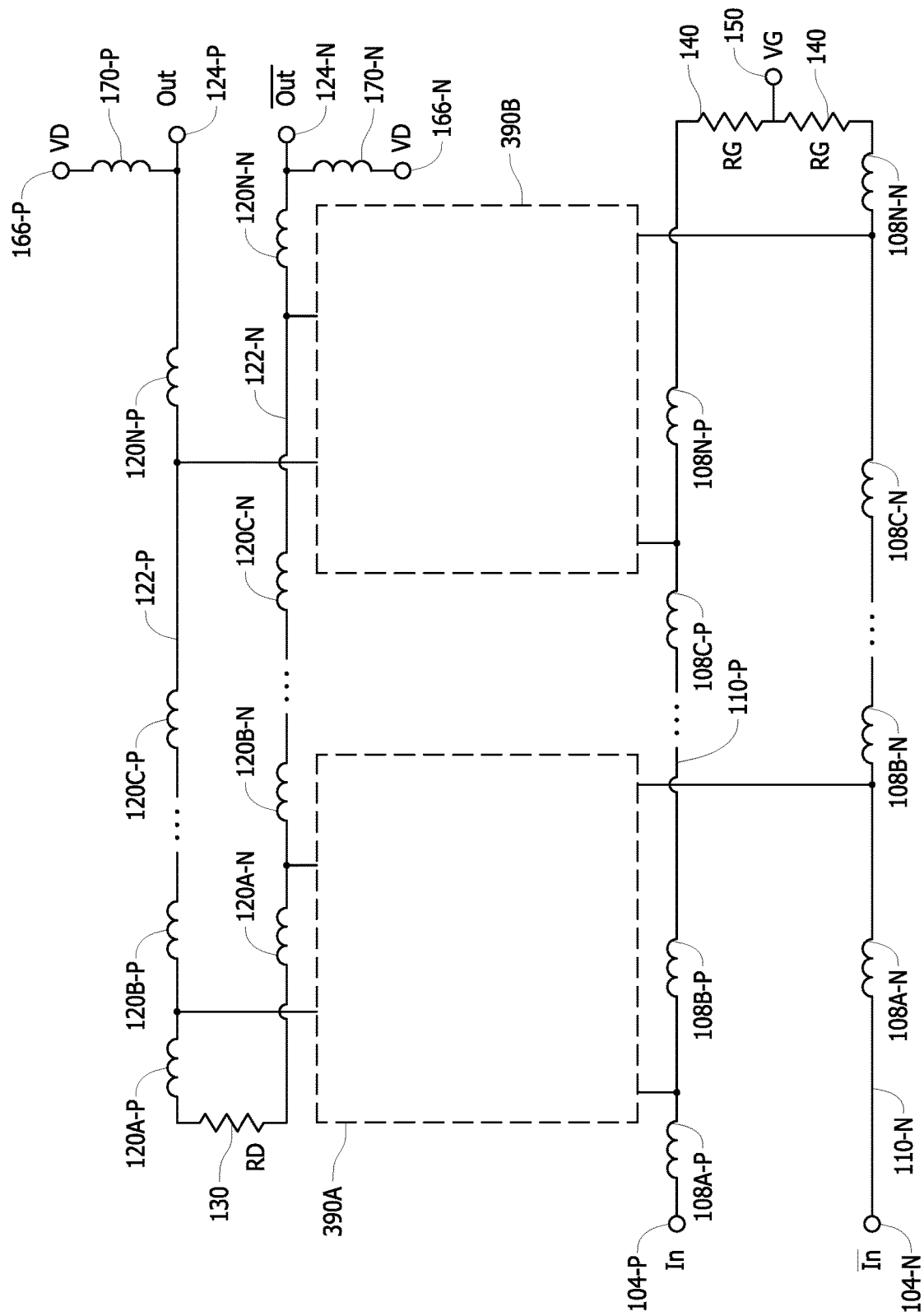
FIG. 3C illustrates the amplifier of FIG. 3A incorporated into differential mode configuration with two or more sections.

FIG. 3B illustrates a block diagram of the amplifier section shown in FIG. 3A. This is but one possible configuration and as such, one or ordinary skill in the art may derive different embodiments from the configurations of FIG. 3A and FIG. 3B without departing from the scope of the claims that follow. As shown, inputs 350A, 350B provide a differential input signal to a pre-driver 354. The pre-driver 354, in combination with the current source 358, amplifies the input signals. The pre-driver 354 serves as a first amplifier stage that amplifies the differential input signals prior to amplification by the additional amplifiers of an amplifier section 372.

A supply voltage node $V_{DDP}$ 362 is provided on the top rail as shown. The pre-driver 354 connects to the supply voltage node 362 through an interstage 368A, 368B as shown. The interstage 368A, 368B function to connect the pre-driver stage 310 and the second stage of the amplifier 224A, 224B. The interstage 368A, 368B appears as a transmission line to improve impedance matching between stages. In this embodiment, a resistor that is part of the interstage 368A, 368B is a termination resistor to terminate the transmission line formed by the interstage.

A voltage divider 364A, 364B connects to the path between the voltage supply node 362 and the pre-driver 354. This connection to the voltage dividers 364A, 364B serve as the inputs to the voltage divider and the amplifier 372. The voltage divider 364A, 364B may be any elements or elements, whether passive or active, which are configured to adjust the voltage provided to as inputs to the amplifier 372. In one embodiment the voltage divider is configured as a RC network as shown in FIG. 3A. In one embodiment, the behavior of the voltage dividers 364A, 364B is frequency dependent.

The amplifier 372 receives the output from the voltage dividers 364A, 364B and perform amplification on the received signals. Any type or configuration of amplifier may be used, and it is contemplated that multiple stages of amplification may be provided. The amplifier and other aspects of the circuit may be in single ended or differential signal configuration. A current source 376 is connected as shown, to the amplifier 372. The amplifier 372 has outputs 380A, 380B configured to provide the amplified output signal.

FIG. 3C illustrates the amplifier of FIG. 3A incorporated into differential mode configuration with two or more sections. In one configuration, two to ten sections are provided. In this embodiment, the amplifier section 390A, 390B are the amplifier section of FIG. 3A or FIG. 4. This shows the amplifier section in an example environment. This is but one possible example embodiment for the amplifier section.

Figure 4:
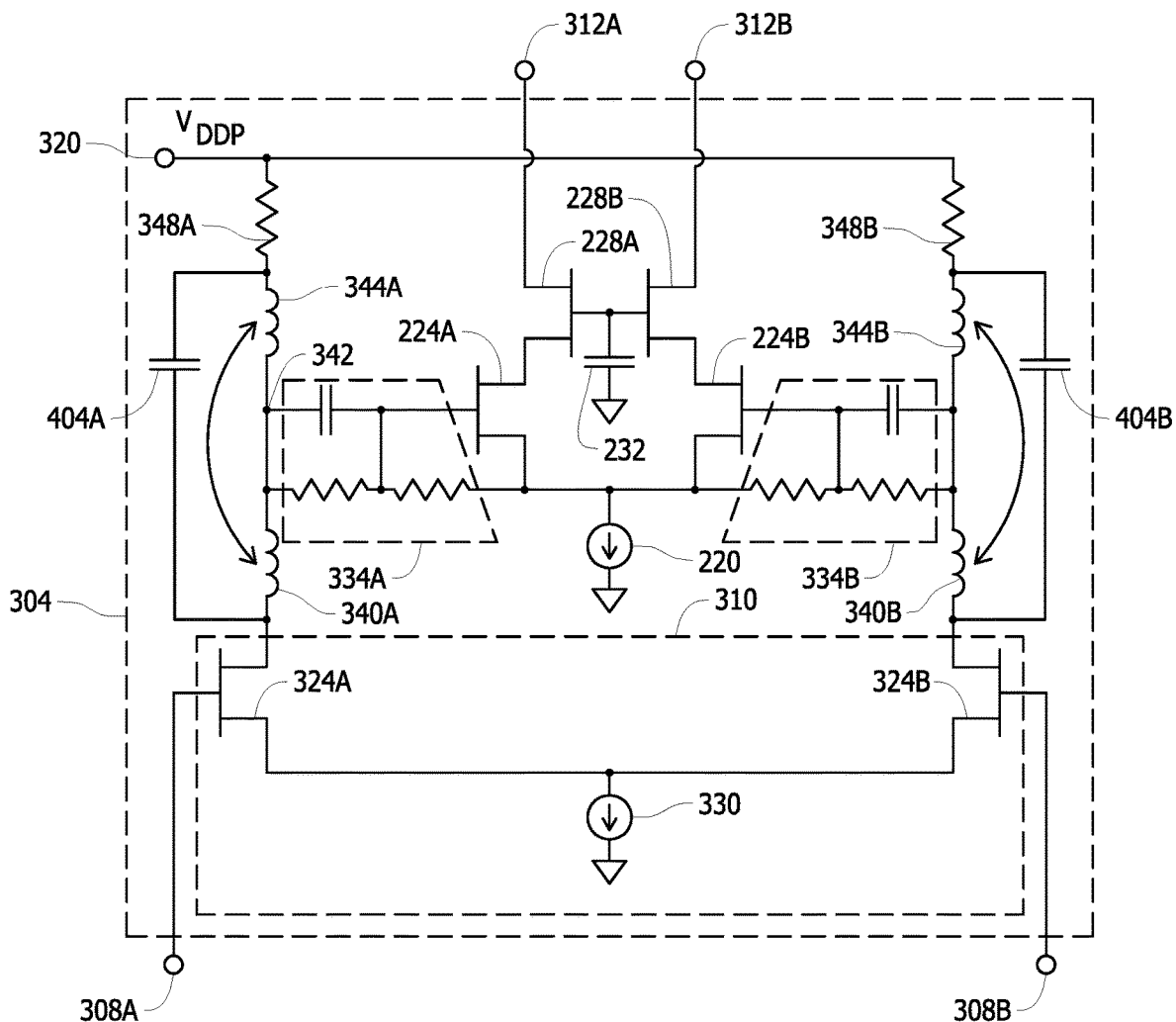
FIG. 4 is an example embodiment of the amplifier section with additional capacitors.

FIG. 4 is an example embodiment of the amplifier section with additional capacitors. To reduce complexity and focus on the innovative aspects of the distributed amplifier, only one amplifier section is shown, but in use multiple amplifier sections may be provided in a distributed amplifier. As compared to FIGS. 1, 2, and 3 similar components are labeled with identical reference numbers and the discussion of those elements are not repeated. In this example embodiment, a capacitor 404A, 404B is connected in parallel to the inductors 340, 344 and inductors 340 and 344 are implemented in a manner that provides mutual inductance between them (as indicated by the arrowed line between inductor 344 and inductor 340). By adding the capacitors and mutual inductance, these elements (404, 340 and 344) form a "constant-R" or "tee-coil" network which provides increased bandwidth as compared to a circuit lacking this element configuration. The capacitor 404A, 404B increases the cutoff frequency. This implementation is also useful to reduce the area occupied by inductors 340 and 344.

Voltage Controlled Attenuator

Figure 5:
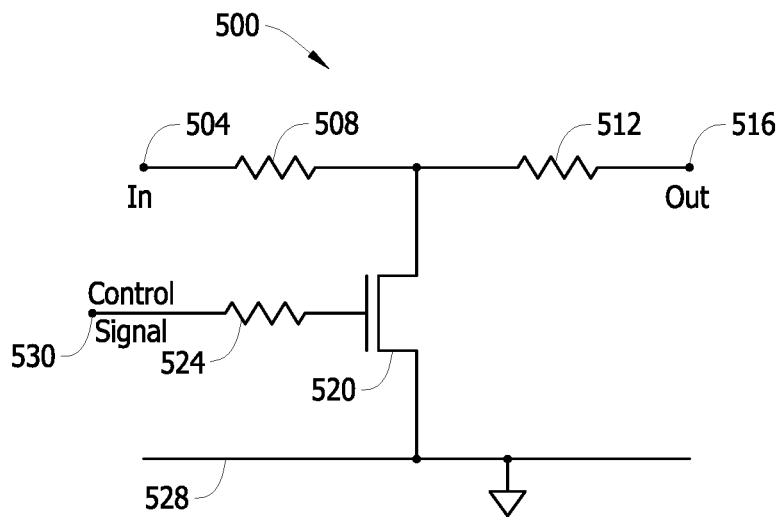
FIG. 5 illustrates an example embodiment of a prior art voltage controlled attenuator (VCA) embodiment in a single ended configuration.

Also disclosed herein is an improved voltage-controlled attenuator (VCA). FIGS. and 6 illustrate an example prior art VCA 500 embodiment. As shown in FIG. 5, the VCA 500 is configured for use with a single ended signal which includes an input terminal 504, which connects to an input resistor 508. The opposite terminal of the input resistor 508 connects to an output resistor 512. Opposite the output resistor 512 is an output terminal 516. A FET 520 connects between the two resistors 508, 512 and a ground node 528 as shown. A control signal node 530, which receives a control signal Vgain, connects to a resistor 524 which connects in series to the gate terminal of the FET 520.

Figure 6:
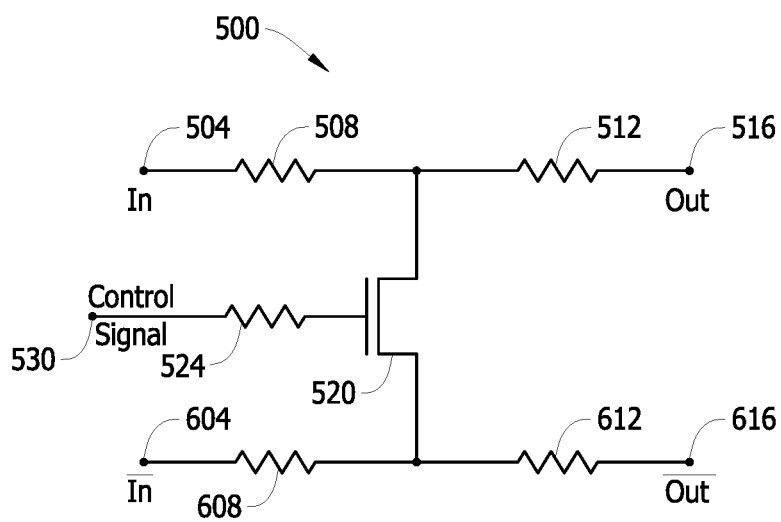
FIG. 6 illustrates an example embodiment of a prior art VCA in a differential signal configuration.

FIG. 6 is generally similar to FIG. 5 but is a differential configuration of the VCA 500 for use with a differential signal. As compared to FIG. 5, identical elements are labeled with identical reference numbers. In FIG. 6, the differential input signals are presented on input terminals 504, 604 and the differential output signals are presented on output terminals 516, 616. Series connected resistors 608, 612 separate the input terminal 604 from the output terminal 616, and are used to present a relatively controlled input and output impedance as the resistance of the FET 520 is varied with the Vgain control voltage.

In operation, the VCA serves to attenuate a signal provided to the input terminal(s). A control signal (Vgain), typically a voltage, is presented to the gate of the FET 520 to control the FET from an off state (non-conducting) into conduction mode. In conduction mode, the FET 520 appears as a variable resistor (a control element) to thus drop a portion of the input signal across the FET, which in turn attenuates the voltage of the signal presented to the output terminal(s). When the FET 520, is off it appears as an open circuit thus passing the entire input signal to the output terminals as an output signal. As the control voltage is applied to the gate terminal of the FET 520, the FET acts as a variable resistor thereby shunting a portion of the input signal across the FET. This attenuates the input signal and thus reduces the magnitude of the signal passed to the output terminal(s) of the VCA 500. Resistors 608 and 612 are used to present a relatively controlled input and output impedance as the resistance of the FET 520 is varied with the Vgain control voltage.

For example, a downstream amplifier may have a gain of 20 dB, but the customer may only need or want 10 dB of gain. In some instances, the customer or user of the amplifier/VCA seeks to control the amplifier gain for different applications or conditions, such as different temperature, different input levels, or any other parameters. To reduce the input signal to the amplifier, the VCA can be used to reduce the magnitude of the input signal to the downstream amplifier. The control signal may be referred to as Vgain since it is a voltage control signal that controls gain of a downstream amplifier by controlling the magnitude of the signal input to the amplifier.

VCA are common elements that are found in use in a wide range of environments and different circuits. A VCA may be used in connection with distributed amplifiers as discussed above in FIGS. 1-4. If connected to the amplifiers of FIGS. 1-4, the single ended VCA 500 of FIG. 5 would connect to the single ended amplifier of FIG. 1 such that the input terminal 504 of the VCA receives the signal to be amplified and the output terminal 516 of the VCA connects to the input terminal 104 of the singled ended amplifier of FIG. 1. Likewise, in a differential signal configuration, the VCA 500 of FIG. 2 would connect to the differential amplifier of FIG. 2 such that the input terminals 504, 604 of the VCA receive the signal to be amplified while the output terminals 516, 616 of the VCA connect to the input terminals 104-P, 104-N of the differential amplifier of FIG. 2. It is contemplated that the distributed amplifier and the VCA may both be configured in the same integrated circuit/package assembly.

Prior art VCA has several drawbacks. One such drawback was that the attenuation range is limited due to the size of a single FET, which affects dynamic range. In addition, use of a single FET limits the dynamic range and linearity of the VCA due to the FET being forced into non-linear operation. The innovation disclosed below overcomes the drawbacks of the prior art.

Figure 7:
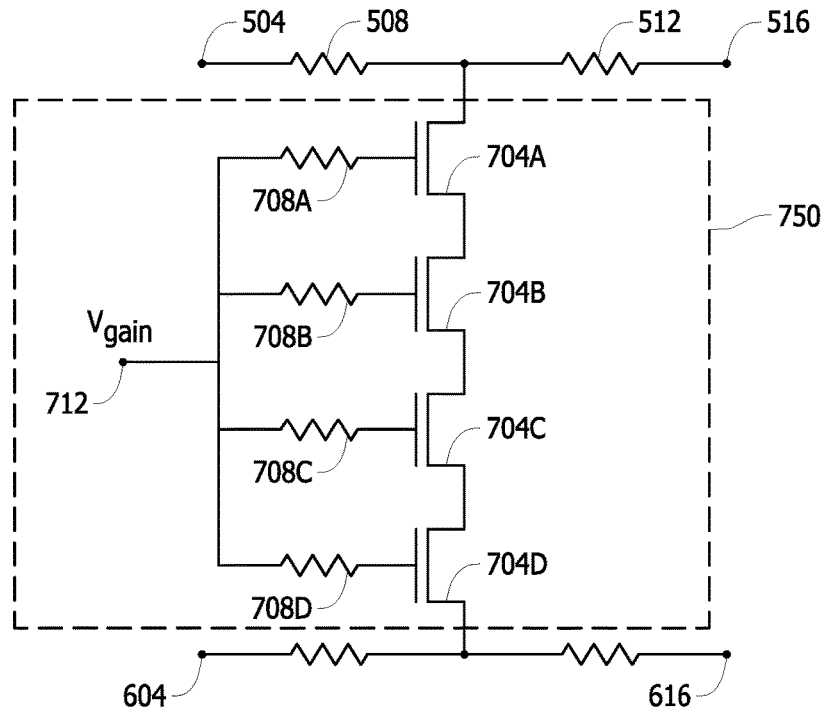
FIG. 7 illustrates a VCA in a differential signal configuration having multiple FETs.

FIG. 7 illustrates a VCA in differential signal configuration having multiple FETs. As compared to FIG. 6 similar elements are labeled with identical reference numbers. In FIG. 7, the single FET 520 is replaced with two or more FETs 704 connected drain to source in series as shown. Although shown with four FETs 704A, 704B, 704C, 704D it is contemplated that any number of two or more FETS may be connected as shown. Resistors 708A, 708B, 708C, 708D connect to the gates of each respective FET. The opposing terminal of each resistor 708 connects to a common input terminal 712, which receives a control signal Vgain.

By stacking the FETS 704 as shown, the voltage swing (differential signal configuration) across the FETs is distributed across the two or more FETs 704. By way of example, if the VCA is configured with one FET 520, the entire voltage swing will occur across the drain to source terminals of the single FET (see FIG. 6). This voltage swing will exceed the linear operating region for the FET leading to operation in the non-linear region, which is unwanted and will lead to signal degradation due to non-linearity.

As disclosed in FIG. 7, stacking two or more FETs 704 causes the voltage swing to be distributed or divided across each of the two or more FETs 704. For example, assuming a 1-volt swing (peak-to-peak) in the prior art, the entire one volt would swing across the FET 520. However, in the configuration of FIG. 7, the 1-volt swing is distributed across the four FETs 704A, 704B, 704C, 704D, thus causing only ¼ volt swing across each FET. In many embodiments, the voltage swing is greater than 1 volt. This configuration prevents operation of the FET in a non-linear region, thereby improving circuit performance. With the FETs 704 operating in the linear region, the FETs act as a variable resistor with a linear response. The FETs 704, resistors 708, and control signal (Vgain) input terminal 712 are collectively referred to as the variable resistance module 750.

The resistance Rbias 708 is generally a large resistance, such as for example but not limited to 1000 ohms. It isolates the control signal Vgain from the FET 704 and prevents or inhibits any high frequency components (non-DC components) in the control signal Vgain (or from any other source) from reaching the gate terminal of the FET. In practice, this large resistance value also decreases capacitive loading on the FET drain and source terminals from the parasitic gate-drain and gate-source capacitance of the FET.

Figure 8:
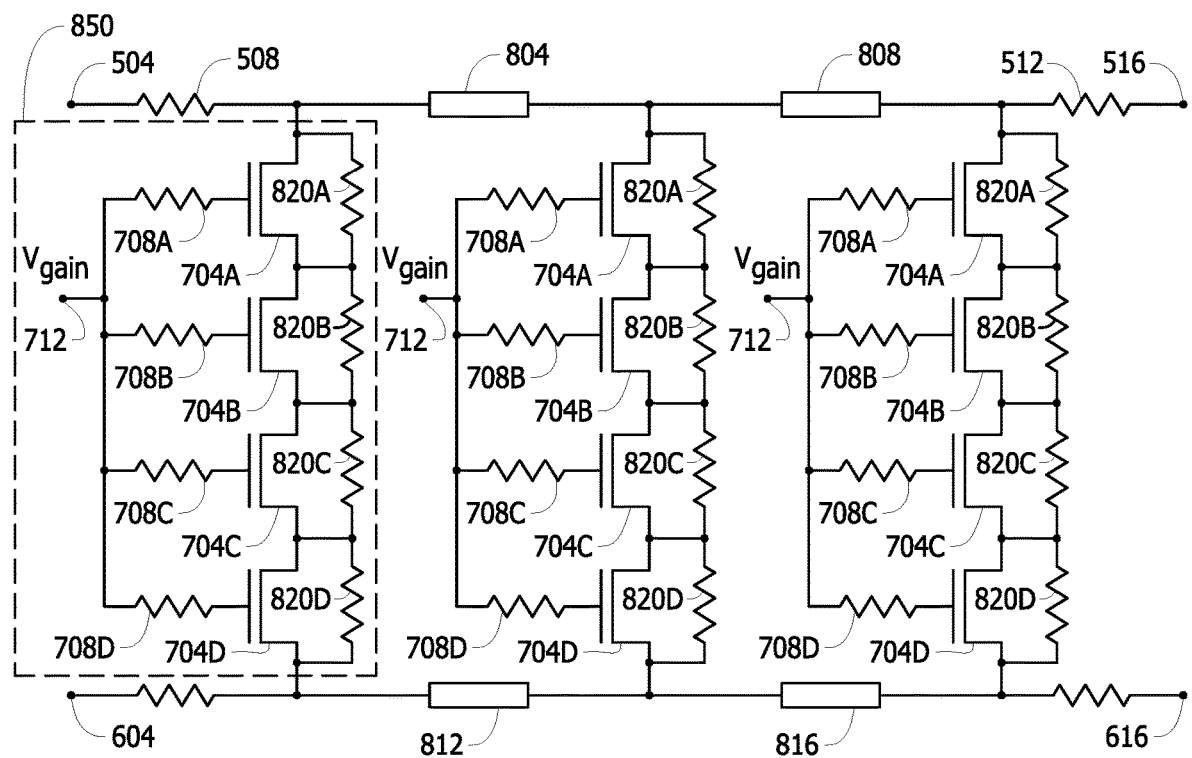
FIG. 8 illustrates a block diagram of a distributed VCA.

FIG. 8 illustrates a block diagram of distributed VCA. As compared to FIGS. 6 and 7, similar elements are labeled with identical reference numbers. This is but one possible embodiment, and it is contemplated that one of ordinary skill in the art may arrive at different configurations that do not depart from the scope of the innovation. In this embodiment, there are multiple variable resistance modules 850 connected as shown between the input terminals 504, 604. Each variable resistance module 850 is generally configured as shown the resistance module 750 of FIG. 7 and operation is generally similar. In addition to the configuration of the variable resistance modules 750, each variable resistance module 850 further includes resistors 820A, 820B, 820C, 820D connected drain to source relative to each or one or more of the FETs. The resistors 820 increase or maintain linearity by maintaining the same voltage (DC) on the drain and source terminal of each FET 704 when the transistors are off. However, without the resistors 820, the DC voltage at the drain terminal and source terminal of the FET may not be the same, especially when the FET is turned off. The resistors 820, which typically have a large value, such as for example but not limited to 1000 ohms, will not unwantedly affect the AC voltage swing across each FET 704. Resistors 820 may also be used in the embodiments of FIGS. 5, 6, and 7.

The embodiment of FIG. 8 also differs from the embodiment of FIG. 7 with the addition of inductors 804, 808, 812, 816. The FETs 704, when off, appear as an open circuit, yet still have a parasitic capacitance. This in turn can result in a different input and output impedance based on the control signal Vgain that is presented to the FET, i.e., different impedance at different gain levels and at different input signal frequencies. The goal however is linear gain control. The inductors 804, 808, 812, 816 cancel or counter the capacitance introduced by the FETs 704 to maintain a generally consistent impedance such as, but not limited to 50 ohms, to thus establish a uniform attenuation (or gain when added to an amplifier) over a wide bandwidth. The inductors 804, 808, 812, 816 are made or formed by small traces, having a selected length and width, on the integrated circuit which is a transmission line and not a traditional inductor. Although in other embodiments any type of element, including a traditional inductor, may be used.

Figure 9:
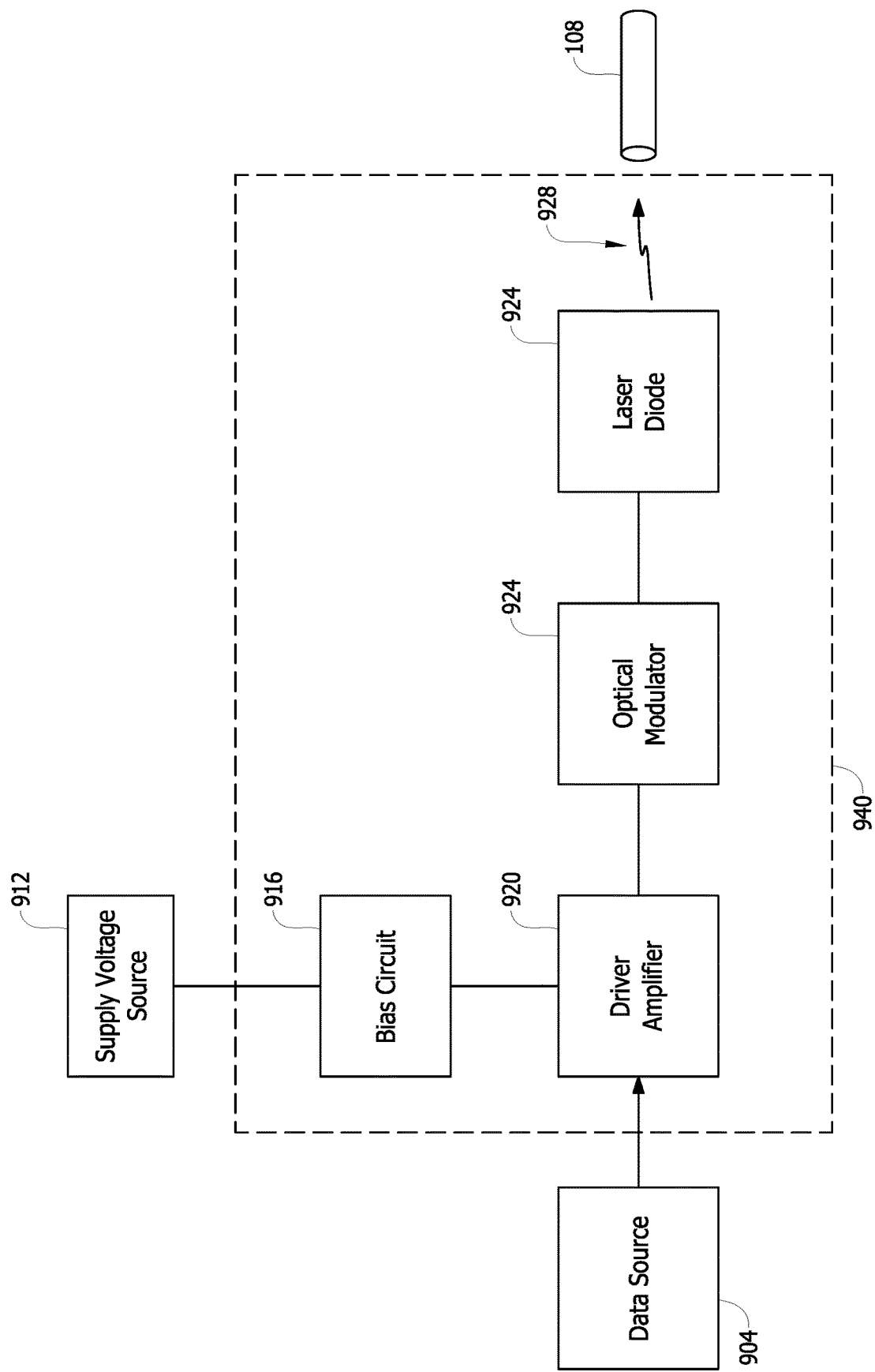
FIG. 9 is a block diagram illustrating an example environment of use of the innovation disclosed herein.

Many environments of use utilize distributed amplifiers and VCAs. Distributed amplifiers are commonly found in optical transmitters to transmit data at high data rates between two locations. Numerous other environments of use rely on distributed amplifiers and gain control elements. Foundational to optical communication systems is a driver amplifier which amplifies a modulating signal onto an optical modulator or directly onto a laser diode. FIG. 9 illustrates a block diagram of an example environment of use, namely, an optic signal transmitter. This is but one possible environment of use and it is contemplated that other environments of use are possible.

As shown in FIG. 9, a data source 904 provides data for eventual transmission over an optic fiber 908. To achieve biasing of a driver, a supply voltage source 912 is provided to deliver power to the system. The supply voltage source 912 may be any source including a hard wire utility supplied power, power supply, battery, or any other source. The supply voltage source 912 provides a supply voltage to a bias circuit 916, which in turn provides a bias voltage to a driver amplifier 920. The driver amplifier 920 also receives the data to be transmitted in optic format from the data source 904. The driver amplifier 920 includes one or more amplifiers configured to amplify and modulate the data to a level suitable for driving an optical modulator or laser diode 924. Responsive to the signal from the driver, the optical modulator or laser diode 924 generates the optic signal 928, which is presented to the fiber optic cable 908, for transmission to a remote location such as for example another device in a data center or to a remote location in long haul applications. In the example configuration of FIG. 9, elements inside the dashed line 940 are on one or more integrated circuits.

Other systems, methods, features, and advantages of the invention will be or will become apparent to one with skill in the art upon examination of the following figures and detailed description. It is intended that all such additional systems, methods, features, and advantages be included within this description, be within the scope of the invention, and be protected by the accompanying claims.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. An attenuator comprising:
a first input configured to receive a first input signal;
a second input configured to receive a second input signal, wherein the first input signal and the second input signal form a differential input signal;
a control signal input configured to receive a control signal that adjusts a level of attenuation of the differential input signal;
a first output configured to present a first output signal;
a second output configured to present a second output signal, wherein the first output signal and the second output signal form a differential output signal which, responsive to the control signal, is an attenuated version of the differential input signal;
a first signal path, having one or more resistors, between the first input and the first output;
a second signal path, having one or more resistors, between the second input and the second output;
a first FET device connected to the first signal path such that a drain terminal of the first FET device connects to the first signal path and a control terminal connects to the control signal input;
at least one additional FET device series connected with the first FET device such that the control terminal of the first FET device and a control terminal of the at least one additional FET device receives the control signal input;
one or more resistors between the control signal input and the control terminal of the first FET device and the control terminal of the at least one additional FET device; and
one or more resistors connected between a drain terminal and a source terminal of each of the first FET device and the at least one additional FET device.

2. The attenuator of claim 1 wherein the control terminal of the first FET device and the control terminal of the at least one additional FET device comprise gate terminals and the attenuator is voltage controlled.

3. The attenuator of claim 1 wherein the FET devices have a gate terminal, a drain terminal, and a source terminal such that the gate terminal receives the control signal, and the FET devices are connected in series, drain to source, between the first signal path and the second signal path.

4. The attenuator of claim 1 wherein a difference between the first input signal and the second input signal is distributed across the first FET device and the at least one additional FET device thereby reducing the voltage across each FET device.

5. The attenuator of claim 1 further comprising an amplifier connected to receive the attenuated version of the differential input signal.

6. A voltage controlled attenuator comprising:
at least one input configured to receive an input signal;
a control signal input configured to receive a control signal that adjusts a level of attenuation applied to the input signal;
at least one output configured to present an attenuated output signal, the attenuated output signal attenuation controlled by the control signal;
at least one signal path, having one or more resistors and one or more inductors, which connect the at least one input to the at least one output;
a first FET device having a drain terminal connected to one of the at least one signal path and a gate terminal configured to receive the control signal input, wherein a portion of the input signal is distributed across the FET device to either a ground or another of the at least one signal path to attenuate the input signal to create the attenuated output signal; and
one or more control signal resistors between the control signal input and the gate terminal of the FET device; and
one or more additional FET devices connected, drain terminal to source terminal, to the FET device; and
one or more resistors connected between the drain terminal and a source terminal of each of the first FET device and the one or more additional FET devices.

7. The voltage controlled attenuator of claim 6 wherein the control signal selectively establishes the FET device as variable resistors.

8. The voltage controlled attenuator of claim 6 further comprising an amplifier connected to receive the output signal as the amplifier's input signal and the control signal controls the gain of the amplifier by attenuating the amplifier's input signal.

9. The voltage controlled attenuator of claim 6 wherein the one or more inductors comprise traces on an integrated circuit and the traces are sized to compensate for capacitance introduced by the FET device.

10. A method for attenuating a signal comprising:
receiving an input signal at a first signal path and a second signal path;
receiving a control signal at a control signal input, the control signal determining an amount of attenuation to be applied to the input signal;
applying the control signal to a gate terminal of two or more FET devices such that the control signal adjusts the resistance of the two or more FET devices, such that the two or more FET devices are series connected, drain terminal to source terminal, between the first signal path and the second signal path;
inhibiting high frequency components in the control signal from reaching a gate terminal of the two or more FET devices with a resistor between the control signal input and the gate terminal of the two or more FET devices;
responsive to the control signal adjusting the resistance of the two or more FET devices, diverting a portion of the input signal from the first signal path to the second signal path through the two or more FET devices which attenuates the input signal to create an attenuated output signal;
maintaining a constant DC voltage across the drain and source terminal of each of the two or more FET devices when the two or more FET devices are off by establishing and maintaining a resistance, with a resistor, across each of the drain terminals and source terminals of the two or more FET devices; and
outputting the attenuated output signal.

11. The method of claim 10 wherein the portion of the input signal that is diverted from the first signal path to the second signal path is distributed across the two or more FET devices, there reducing a voltage drop across each FET device.

12. The method of claim 10 wherein the input signal is a differential signal.

13. The method of claim 10, further comprising compensating the capacitance introduced by the two or more FET devices to maintain a generally consistent impedance over a wide bandwidth with one or more inductors, located in the first signal path, and the second signal path, the one or more inductors canceling or counteracting capacitance from the two or more FET devices.

14. An attenuator comprising:
a first input configured to receive a first input signal;
a second input configured to receive a second input signal, wherein the first input signal and the second input signal form a differential input signal;
a control signal input configured to receive a control signal that adjusts a level of attenuation of the differential input signal;
a first output configured to present a first output signal;
a second output configured to present a second output signal, wherein the first output signal and the second output signal form a differential output signal which, responsive to the control signal, is an attenuated version of the differential input signal;
a first signal path, having one or more resistors, between the first input and the first output;
a second signal path, having one or more resistors, between the second input and the second output;
a first FET device, having a drain terminal, a source terminal and a control terminal, connected to the first signal path such that the drain terminal of the first FET device connects to the first signal path and the control terminal connects to the control signal input;
at least one additional FET device, each having a drain terminal, a source terminal and a control terminal, series connected with the first FET device such that the control terminal of the first FET device and a control terminal of the at least one additional FET device connect to the control signal input; and
one or more resistors connected between the drain terminal and the source terminal of each of the first FET device and the at least one additional FET device.

\* \* \* \* \*